(12) United States Patent
Coster et al.

(10) Patent No.: US 9,901,881 B2
(45) Date of Patent: Feb. 27, 2018

(54) MEMBRANE AND MEMBRANE SEPARATION SYSTEM

(75) Inventors: Hans Gerard Leonard Coster, Randwick (AU); Tahereh Darestani Farahani, Redfern (AU); Terry Calvin Chilcott, Camperdown (AU)

(73) Assignee: CMS INNOVATIONS PTY LTD, Point Piper, NSW (AU)

( * ) Notice: Subject to any disclaimer, the term of this patent is extended or adjusted under 35 U.S.C. 154(b) by 1500 days.

(21) Appl. No.: 13/512,211

(22) PCT Filed: Nov. 25, 2010

(86) PCT No.: PCT/AU2010/001582
§ 371 (c)(1),
(2), (4) Date: Oct. 2, 2012

(87) PCT Pub. No.: WO2011/063458
PCT Pub. Date: Jun. 3, 2011

(65) Prior Publication Data
US 2013/0026088 A1 Jan. 31, 2013

(30) Foreign Application Priority Data
Nov. 25, 2009 (AU) .................................. 2009905768

(51) Int. Cl.
*B01D 39/00* (2006.01)
*B01D 39/14* (2006.01)
(Continued)

(52) U.S. Cl.
CPC ..... *B01D 67/0081* (2013.01); *B01D 67/0083* (2013.01); *B01D 69/02* (2013.01);
(Continued)

(58) Field of Classification Search
CPC .......... C12Q 2523/307; B01F 13/0071; B01D 2321/22; B01D 67/0081; B01D 67/0083;
(Continued)

(56) References Cited

U.S. PATENT DOCUMENTS 4,241,128 A * 12/1980 Wang .......................... C08J 5/18
264/435
4,867,881 A * 9/1989 Kinzer .......................... 210/490
(Continued)

FOREIGN PATENT DOCUMENTS

DE 3524799 A1 1/1987
JP 04-104821 A 4/1992
(Continued)

OTHER PUBLICATIONS

PB81203101, Development of non-fouling piezoelectric ultrafiltration membranes, Pennwalt Corp. King of Prussia PA, Aug. 1980, Ntis.*
(Continued)

*Primary Examiner* — Ana Fortuna
(74) *Attorney, Agent, or Firm* — Ladas & Parry LLP

(57) ABSTRACT

Described herein is a method for altering the characteristics of a membrane comprising a dielectric material. The method comprises heating the membrane and applying an electric field in a direction out of the plane of the membrane to at least a portion of the dielectric material. At least a portion of the dielectric material becomes aligned with the applied electric field. In some embodiments, the membrane is piezoelectric and application of an electric signal to the membrane causes out of plane movement of the membrane. Also disclosed are membranes and systems and apparatuses comprising such membranes.

20 Claims, 4 Drawing Sheets

(51) Int. Cl.
   *B01D 63/00* (2006.01)
   *B01D 67/00* (2006.01)
   *H01L 37/02* (2006.01)
   *B01D 69/02* (2006.01)
   *B01D 69/08* (2006.01)
   *H01L 41/08* (2006.01)
   *H01L 41/047* (2006.01)
   *H01L 41/09* (2006.01)

(52) U.S. Cl.
   CPC .............. *B01D 69/08* (2013.01); *H01L 37/02* (2013.01); *B01D 2321/22* (2013.01); *B01D 2325/26* (2013.01); *H01L 41/0477* (2013.01); *H01L 41/0805* (2013.01); *H01L 41/0973* (2013.01)

(58) Field of Classification Search
   CPC ........ B01D 69/02; B01D 71/64; B01D 71/68; C07K 1/047; H01L 37/02; H01L 41/0477; H01L 41/0805; H01L 41/0973; H01L 41/37
   USPC ........... 210/500.29, 500, 36, 500.27, 500.38; 264/41, 48
   See application file for complete search history.

(56) References Cited

U.S. PATENT DOCUMENTS

| | | | |
|---|---|---|---|
| 4,904,394 A | | 2/1990 | Clarke et al. |
| 5,160,616 A | * | 11/1992 | Blake-Coleman ..... B01D 29/01 210/321.64 |
| 5,552,656 A | | 9/1996 | Taylor |
| 5,684,061 A | | 11/1997 | Ohnishi et al. |
| 5,968,994 A | * | 10/1999 | Hashimoto et al. .......... 521/143 |
| 6,479,007 B1 | | 11/2002 | Greenberg et al. |
| 6,676,993 B2 | * | 1/2004 | Klare ............................ 427/245 |
| 6,706,088 B2 | | 3/2004 | Tsujita et al. |
| 2002/0041003 A1 | * | 4/2002 | Udrea et al. .................. 257/502 |
| 2002/0060193 A1 | * | 5/2002 | Ando ................... B01D 61/145 210/798 |
| 2005/0058821 A1 | * | 3/2005 | Smith et al. ................ 428/304.4 |
| 2006/0102467 A1 | * | 5/2006 | Herchen et al. ........... 204/230.2 |
| 2008/0176965 A1 | | 7/2008 | Qi et al. |
| 2009/0188857 A1 | * | 7/2009 | Moore et al. ............ 210/500.34 |
| 2011/0285038 A1 | * | 11/2011 | Lin ..................... A61M 1/1698 261/101 |

FOREIGN PATENT DOCUMENTS

| | | | |
|---|---|---|---|
| JP | 2000-229226 | * | 8/2000 |
| JP | 2000-229226 A | | 8/2000 |
| JP | 2005-314526 A | | 11/2005 |
| KR | 2004-0092332 | * | 11/2004 |
| KR | 20040092332 A | | 11/2004 |
| TW | I305966 B | | 2/2009 |
| WO | 86/07284 A1 | | 12/1986 |

OTHER PUBLICATIONS

International Search Report; mailed Jan. 20, 2011; PCT/AU2010/001582.
H. Li, et al; "Direct observation of particle deposition on the membrane surface during crossflow microfiltration", Journal of Membrane Science, vol. 149, Issue 1, pp. 83-97, Oct. 14, 1998.
D.Y. Kwon, et al; "Experimental determination of critical flux in cross-flow microfiltration", Separation and Purification Technology, vol. 19, Issue 3, pp. 169-181, Jul. 1, 2000.
Y.P. Zhang, et al; "Critical flux and particle deposition of bidisperse suspensions during crossflow microfiltration", Journal of Membrane Science, vol. 282, Issues 1-2, pp. 189-197; Oct. 5, 2006.
N. Ahner, et al; "Piezoelectrically Assisted Ultrafiltration", Separation Science and Technology, vol. 28, Issues 1-3, pp. 895-908, 1993 exact date not given online.
W.D. Benzinger, et al; "Development of non-fouling piezoelectric ultrafiltration membranes", Final Rept. 1, Sep 79-31, Aug. 1980, Penwalt Corp., King of Prussia, PA, 27 pages.
A.S. Dereggi, et al; "Piezoelectric polymer probe for ultrasonic applications", The Journal of The Acoustical Society of America, vol. 69, Mar. 1982 No. 3, pp. 853-859; XP-001419280.
E. Venkatragavaraj, et al. "Piezoelectric properties of ferroelectric PZT-polymer composites", Journal of Physics D: Applied Physics, vol. 34, No. 4, pp. 487-492. Feb. 2001.
Extended European Search Report dated Oct. 10, 2016: Appln. No. 10832420.3-1370/2504082 PCT/AU2010001582.

* cited by examiner

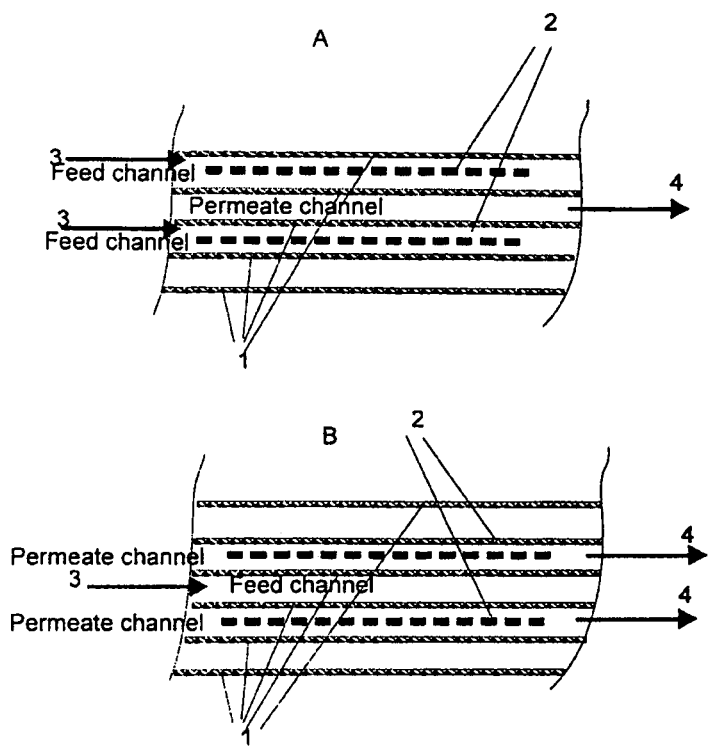
Figures 5A (top) and 5B (bottom)
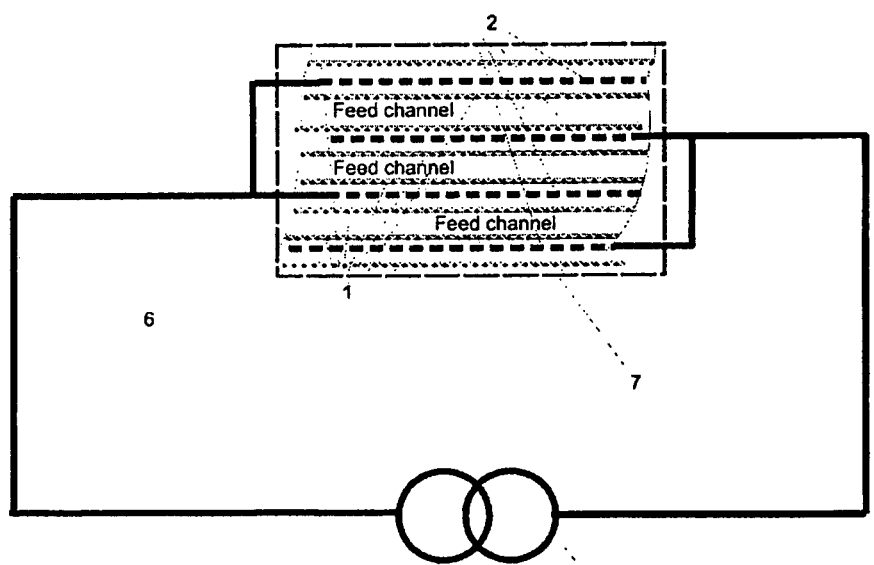
Figure 6

MEMBRANE AND MEMBRANE SEPARATION SYSTEM

FIELD OF THE INVENTION

The invention relates to methods for the manufacture of membranes and to membrane separation systems.

BACKGROUND TO THE INVENTION

A membrane is a layer of material which serves as a selective barrier between two phases and remains at least partially impermeable to certain particles, molecules, or substances when exposed to the action of a driving force. Some materials are able to pass through the membrane and into a permeate stream, whereas others are not and accumulate in the retentate stream.

Many types of membranes are porous (e.g. micro-porous, nano-porous and ultra filtration membranes). In porous membranes, the pore size and distribution affects the permeability of the membranes to specific particles, molecules or substances. Other types of membranes are not porous (e.g. Reverse Osmosis membranes), and it is the physicochemical properties of such membranes that affect their permeability to specific particles, molecules or substances. Numerous methods have been used to prepare membranes having desired physicochemical properties, pore size and distribution in order to provide desired permeability properties for particular applications.

Membranes are used in membrane separation systems for a wide variety of processes in which it is desired to remove or reduce the concentration of certain materials in a fluid. For example, membrane separation systems have been used to purify waste water effluents from industrial and domestic sources. Membrane separation systems are also increasingly being used to produce fresh water from sea water or brackish water supplies by removing the salt, and other contaminants, from a saline feed.

During operation, the surface of the membrane can become covered with materials present in the feed fluid to which the membrane is highly impermeable, i.e. the membrane rejects the materials, but not the fluid in which they are suspended or dissolved. The flux of fluid permeating through the membrane is then largely devoid of such materials. The materials rejected by the membrane (referred to as the retentate) are typically swept away from the surface of the membrane by maintaining a flow of fluid parallel to the surface (commonly called a cross flow). The retentate (also referred to as the sludge) is collected at the opposite end of the membrane where it is discarded.

Under some circumstances, some of the materials that are present in the sludge at high concentrations become attached, in some circumstances permanently, to the surface of the membrane. This process is known as "fouling". Fouling leads to a reduced permeate flux and can also lead to a decrease in the rejection characteristics of the membrane. The latter is, for instance, very important in the performance of so called "Reverse Osmosis" membranes for removing salt from sea water or brackish feed water. Fouling in such membranes will give rise to reduced salt rejection and hence lower quality (higher salinity) permeate fluxes.

The replacement or treatment of fouled membranes can be a significant cost in the operation of membrane separation systems. Accordingly, it is desirable to reduce the incidence of fouling in membrane separation systems.

SUMMARY OF THE INVENTION

The present inventors have discovered a new method by which the properties of certain membranes can be modified, thus providing an alternative means for preparing membranes having desirable properties (e.g. different permeation and separation properties). In particular, the inventors have found that applying an electric field to a membrane comprising a dielectric material in a direction out of the plane of the membrane can modify the properties of the membrane. If the dielectric material is a piezoelectric material, the resultant membranes also have piezoelectric properties and the inventors have further found that the piezoelectric properties can be utilized in membrane separation systems to reduce fouling.

In a first aspect, the present invention provides a method for altering the characteristics of a membrane comprising a dielectric material. The method comprises heating the membrane and applying an electric field in a direction out of the plane of the membrane to at least a portion of the dielectric material, whereby at least a portion of the dielectric material becomes aligned with the applied electric field.

In a second aspect, the present invention provides a method for preparing a membrane comprising a dielectric material. The method comprises heating the membrane and applying an electric field in a direction out of the plane of the membrane to at least a portion of the dielectric material during the manufacture of the membrane.

In a third aspect, the present invention provides a method for preparing a membrane comprising a poled piezoelectric material. The method comprises poling at least a portion of the piezoelectric material in the membrane in a direction out of the plane of the membrane.

In a fourth aspect, the present invention provides a membrane comprising a dielectric material, wherein at least a portion of the dielectric material is aligned in a direction out of the plane of the membrane.

In a fifth aspect, the present invention provides a membrane comprising a dielectric material, wherein at least a portion of the dielectric material is aligned in a direction substantially perpendicular to the plane of the membrane.

As used herein, the expression "dielectric material" refers to a material that can support an uneven charge distribution when an electric field is applied to the material. Dielectric materials may have permanent electric dipoles (where the charge distribution in the material is permanently non-uniform, for example, in the case of polar molecules) or induced electric dipoles (where an electric dipole is formed in the material because of the conditions to which the material is exposed, for example, to an electric field).

Dielectric materials will become polarised when an electric field is applied to the material due to the (permanent or induced) uneven charge distribution in the material causing the material to have a dipole moment. When the electric field is applied, the dipole moment (and hence the chemical species in the dielectric material) will tend to become aligned with the electric field, subject to other factors constraining movement of the dielectric material. For example, when the dielectric material is a dielectric polymer, the polymer chains will tend to become aligned with the applied electric field, but may be constrained from doing so because they are mechanically intertwined with other polymer chains. When the electrical field is applied at a temperature just below the melting point of the material, at least some of the factors constraining movement of species in the dielectric material will be overcome and the dielectric material will have more freedom to become aligned with the electric field. Upon cooling, the dielectric material may remain aligned, even after the electric field is removed.

As used herein, the expression "at least a portion of the dielectric material is aligned in a direction" is intended to mean that a significant proportion of the dielectric material is aligned in the specified direction (i.e. more than the proportion of the dielectric material that would statistically be expected to be aligned in that direction in a sample not exposed to an intense electrical field).

The degree to which a dielectric material can be polarised by an applied electric field can be quantified using the material's dielectric constant. In general, the larger a material's dielectric constant, the more polarisable the material will be. Materials with permanent dipoles will have larger dielectric constants than non-polar materials. The inventors' believe that dielectric materials having a dielectric constant greater than 1 (e.g. from about 2 to about 4) have application in the present invention.

A dielectric material may be a piezoelectric material. As used herein, the expression "piezoelectric material" refers to a material that can be poled to produce a material having piezoelectric properties (i.e. to produce a piezoelectrically-active material). Similarly, the expressions "piezoelectric polymer", "piezoelectric inorganic material" and "piezoelectric ceramic material" refer to a polymer, inorganic material or ceramic material, respectively, that can be poled to produce a material having piezoelectric properties. Piezoelectric materials, including piezoelectric polymers and piezoelectric ceramic materials, comprise dipoles. "Poling" is a process comprising applying an electric field to a piezoelectric material to align the dipoles within the material to produce a piezoelectrically-active material. Typically, the electrical field is applied at a temperature just below the melting point of the material, and the material is then cooled whilst exposed to the electrical field. Upon cooling, the electric dipoles in the material remain aligned, even after the removal of the electrical field.

As noted above, a membrane is a layer of material which serves as a selective barrier between two phases. As used herein, a reference to the "plane of the membrane" is a reference to the plane defined by the layer of material, regardless of the form in which the membrane is ultimately provided or used (e.g. in a "spiral-wound", cylindrical or hollow fibre membrane module or the like).

In the present invention, an electric field is applied in a direction out of the plane of the membrane (e.g. at least a portion of the membrane is poled in a direction out of the plane of the membrane). That is, if the membrane were laid flat, the direction of the applied electric field would be out of the plane defined by the membrane. It will be appreciated that, in use, the membrane may not be flat and may, for example, be curved or in some other configuration.

The inventors have discovered that applying an electric field in a direction out of the plane of a membrane comprising a dielectric material (e.g. poling a membrane comprising a piezoelectric material in a direction out of the plane of the membrane), either during manufacture of the membrane or after the membrane has been formed, can change the internal structure of the membrane. Without wishing to be bound by theory, the inventors believe that this is a result of the alignment of the electric dipoles of the dielectric material in the membrane when the electric field is applied. This process can modify the original internal structure of the membrane (even if the dielectric material does not become fully aligned in the applied electric field or remain aligned in the membrane after the electric field is removed), and thereby provides an additional method by which the properties of the membrane, including pore size distribution and porosity of the membrane, can be controlled. The inventors believe that aligning the dielectric material in the membrane in a direction out of the plane of the membrane results in the microstructure of the material being changed in the direction in which filtration will occur through the membrane.

The inventors have found that the characteristics of membranes of the present invention differ from the characteristics of membranes formed from similar materials, but which have not been exposed to an electric field, at least in respect of their molecular weight cut-off (MWCO), surface topographies, microstructures and fouling behavior.

In some embodiments of the methods of the first and second aspects, at least a portion of the dielectric material in the membrane remains aligned in a direction out of the plane of the membrane after the electric field has been removed.

In some embodiments of the methods of the first to third aspects, the electric field is applied in a direction substantially perpendicular to the plane of the membrane.

In some embodiments, the dielectric material is a dielectric polymer. The polymer may, for example, be selected from the following: polyvinylidene fluoride (PVDF), poly sulfone, poly ethersulfone (PES), nylon, polypropylene (PP), polyester, cellulose acetate (CA), polycarbonate (PC), Teflon, polyamide (PA), thin film polyamide, composite polyamide and combinations thereof.

In some embodiments, the dielectric material is a piezoelectric material (e.g. a piezoelectric polymer or a piezoelectric ceramic material). Alternatively, the membrane may comprise both a piezoelectric inorganic (e.g. ceramic) material and a piezoelectric polymer.

The piezoelectric polymer may, for example, be selected from the following: polyvinylidene fluoride (PVDF) and its copolymers such as poly (vinylidene-triflouroethylene), poly amides such as nylon-7, nylon-11 and nylon-6, poly (vinyl chloride), poly(acrylonitrile), poly(vinyl acetate) and its copolymers such as poly(vinylidenecyanide-vinylacetate), vinylidene cyanide copolymers with monomers such as vinyl benzoate and methyl methacrylate, poly(phenylethernitrile), nitrile-substituted polyimides such as poly(bicyclobutanecarbonitrile), poly-(α-hydroxy acids) such as poly-(lactide) and its copolymers and poly-(glycolides) and its copolymers, collagen, polypeptides such as poly-g-methylglutamate and poly-g-benzyl-L-glutamate, DNA, chitin, chitosan and combinations thereof.

The piezoelectric inorganic (e.g. ceramic) material may, for example, be selected from the following: quartz crystals and man-made ceramics such as piezoceramics, lead zirconate titanate (more commonly known as PZT), and lead-free piezoceramics such as bismuth ferrite ($BiFeO_3$), sodium niobate ($NaNbO_3$) and combinations thereof.

In embodiments in which the dielectric material is a piezoelectric material, as a result of the poling process (e.g. in a direction substantially perpendicular to the membrane), the resulting membranes will exhibit piezoelectric properties. The membranes will thus undergo mechanical deformation in the transverse direction (i.e. out of the plane of the membrane) upon the application of an electric potential across the membrane. The inventors have found that this property can be used in membrane separation systems to reduce fouling of the membrane and to enhance the permeate flux.

In a sixth aspect, the present invention provides a membrane, wherein at least a portion of the membrane is piezoelectric having a direction of poling whereby application of an electric signal to the membrane causes out of plane movement of the membrane.

In a seventh aspect, the present invention provides a membrane, wherein at least a portion of the membrane is piezoelectric having a direction of poling substantially perpendicular to the plane of the membrane.

In some embodiments, a portion of the membrane may be piezoelectric and another portion of the membrane not be piezoelectric.

In an eighth aspect, the present invention provides a membrane separation system for separating one or more components from a fluid. The system comprises a membrane separating a fluid inflow region and a fluid outflow region. At least a portion of the membrane comprises a dielectric material, at least a portion of the dielectric material being aligned in a direction out of the plane of the membrane (e.g. in a direction substantially perpendicular to the plane of the membrane).

In a ninth aspect, the present invention provides an apparatus for separating one or more components from a fluid. The apparatus comprises:
(a) a membrane separating an inflow region and an outflow region, wherein at least a portion of the membrane comprises a dielectric material and wherein at least a portion of the dielectric material is aligned in a direction out of the plane of the membrane (e.g. in a direction substantially perpendicular to the plane of the membrane);
(b) a fluid inlet for introducing the fluid into the inflow region;
(c) a retentate outlet for removing retentate from the inflow region; and
(d) a permeate outlet for removing permeate from the outflow region.

In some embodiments of the eighth and ninth aspects, the dielectric material is a piezoelectric material having a direction of poling whereby application of an electric signal to the membrane causes out of plane movement of the membrane.

Typically, the membrane separation system and apparatus further comprise electrodes adapted to provide an electric signal to at least part of the piezoelectric portion of the membrane. An alternating electric signal provided by the electrodes causes the piezoelectric portion of the membrane to alternatively expand and contract.

Typically, the membrane separation system and apparatus further comprise an electrical supply source to provide the alternating electric signal to the electrodes.

In some embodiments, the fluid inlet may be adapted to introduce fluid into the inflow region such that it flows across the surface of the membrane (e.g. laterally). This is known in the art as a "cross-flow".

In some embodiments, the apparatus comprises a plurality of layered membranes, each membrane being separated by channels that define the inflow and outflow regions.

In some embodiments, the apparatus comprises one or more membranes wound around a central axis to define a spiral wound membrane module, where each membrane is separated by channels that define the inflow and outflow regions.

In embodiments in which the apparatus comprises channels, electrodes adapted to provide an electric signal across at least part of the piezoelectric portion of the membrane may be provided in those channels.

In a tenth aspect, the present invention provides an apparatus including a membrane according to the any of the fourth to seventh aspects, or a membrane formed by the method any of the first to third aspects.

BRIEF DESCRIPTION OF THE DRAWINGS

Embodiments of the present invention will now be described by way of example only with reference to the accompanying drawings in which:

FIG. 5A is a schematic diagram illustrating a cut-away view of another embodiment of a membrane separation module of the present invention;

FIG. 5B is a schematic diagram illustrating a cut-away view of another embodiment of a membrane separation module of the present invention;

FIG. 6 depicts a cut-away view of another embodiment of a membrane separation module of the present invention, showing the electrical spacers in the membrane separation module connected to a wave form generator.

DETAILED DESCRIPTION OF THE INVENTION

Figure 1:
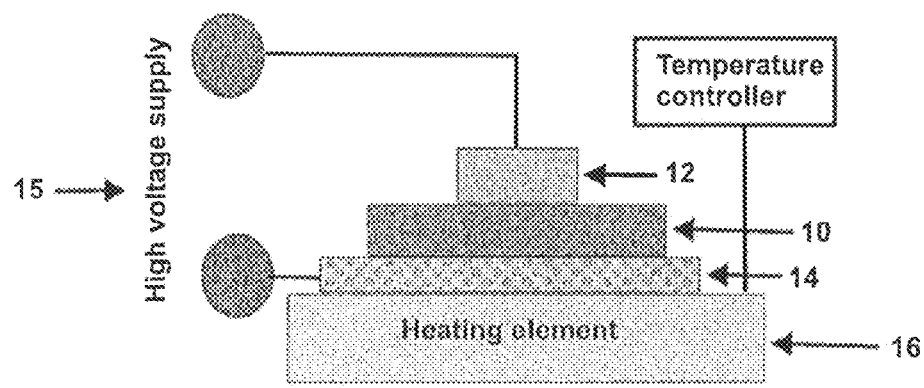
FIG. 1 is a schematic diagram of an apparatus that can be used to apply an electric field to a membrane comprising a dielectric material in accordance with an embodiment of the present invention.

As discussed above, the present invention relates to methods for altering the characteristics of a membrane comprising a dielectric material by heating the membrane and applying an electric field in a direction out of the plane of the membrane (either during the manufacture of the membrane or after the membrane is formed) to at least a portion of the dielectric material in the membrane. By applying an electric field to the dielectric material in the membrane, at least a portion of the dielectric material becomes aligned with the applied electric field (i.e. aligned in a direction out of the plane of the membrane), at least whilst the electric field is applied.

In some embodiments, the present invention relates to methods for altering the characteristics of a membrane comprising a piezoelectric material, by poling (either during the manufacture of the membrane or after the membrane is formed) at least a portion of the piezoelectric material in the membrane in a direction out of the plane of the membrane.

Membranes are used to separate one or more components from a fluid (typically a gas or a liquid, more typically a liquid), that is, to reduce the proportion of the one or more components in the fluid. To separate the one or more components from a fluid, the membrane is selected such that the membrane is less permeable, or, alternatively, more permeable, to the one or more components than other components in the fluid. For example, to separate one or more molecules or substances from an aqueous solution, a membrane may be selected that is less permeable to the one or molecules or substances than to water.

For a given application, a membrane having the desired permeability characteristics is selected. As mentioned above, membranes may be formed from a variety of different materials and numerous techniques are known in the art for preparing membranes and for modifying the permeability characteristics of a membrane (e.g. by modifying the pore size and distribution of the membrane or by modifying the physicochemical properties of the membrane). The surfaces of membranes have also been treated or chemically modified to alter the characteristics of the membrane. The methods of the present invention provide an alternative (or additional) method for modifying the characteristics of a membrane comprising a dielectric material.

The inventors have found that the microstructure of membranes comprising a dielectric material can be dramatically changed by applying an electric field to the membrane in a direction out of the plane of the membrane. The present invention therefore provides another method by which a membrane's structure and permeability (and hence separation characteristics) can be manipulated. Indeed, the inventors' experiments have demonstrated that they can alter the characteristics of a membrane's molecular weight cut off, microstructure, surface topography and fouling behavior. The inventors expect that the present invention could also be applied to alter other characteristics of membranes comprising a dielectric material, such as its propensity to foul and its hydraulic permeability.

Dielectric Materials

Any dielectric material which can be incorporated into or used to form a membrane may be used in the present invention. The dielectric material may, for example, have a permanent dipole (e.g. a piezoelectric material) or an induced dipole. An induced dipole can, for example, be formed in the dielectric material by applying an electric field to the material. On application of the electric field, at least a portion of the dielectric material in the membrane becomes aligned in a direction out of the plane of the membrane, that is, the dipole moments of at least some of the chemical species of the dielectric material in the membrane become aligned with the electric field.

The dielectric material may, for example, be a dielectric polymer such as polyvinylidene fluoride (PVDF), poly sulfone (PSU), poly ethersulfone (PES), nylon, polypropylene (PP), polyester, cellulose acetate (CA), polycarbonate (PC), Teflon, polyamide (PA), thin film polyamide, composite polyamide or a combination of two or more of the listed polymers. Alternatively, the dielectric material may, for example, be an inorganic (e.g. ceramic) dielectric material such as silicon carbide or alumina.

The dielectric material may, for example, be a piezoelectric material (e.g. a piezoelectric polymer or a piezoelectric ceramic material). Alternatively, the membrane may comprise both a piezoelectric inorganic material and a piezoelectric polymer. Suitable piezoelectric materials will be discussed in more detail below.

Exemplary membranes comprising dielectric materials are listed in the following Table.

| Type of membrane | No. | Dielectric material | Pore size (micron) |
| --- | --- | --- | --- |
| Micro-filtration | 1 | PVDF | 0.2 |
| | 2 | PES | 0.2 |
| | 3 | PES | 0.1 |
| | 4 | Nylon | 0.2 |
| | 5 | Nylon | 0.1 |
| | 6 | PP | 0.2 |
| | 7 | PP | 0.1 |
| | 8 | Polyester | 0.2 |
| | 9 | CA | 0.2 |
| | 10 | PC | 1 |

-continued

| Type of membrane | No. | Dielectric material | Pore size (micron) |
| --- | --- | --- | --- |
| | 11 | PC | 0.8 |
| | 12 | PC | 0.6 |
| | 13 | PC | 0.4 |
| | 14 | PC | 0.2 |
| | 15 | Teflon | 0.2 |
| Ultra-filtration | 1 | Thin Film-Polyamide | NA |
| | 2 | Composite polyamide | NA |
| | 3 | Cellulose acetate | NA |
| | 4 | PES | 0.03 |
| | 5 | Polysulfone | NA |
| | 6 | PES | NA |
| | 7 | PVDF | NA |
| | 8 | PVDF | NA |
| | 9 | PVDF | NA |
| | 10 | PVDF | NA |
| | 11 | PVDF | NA |
| | 12 | PVDF | NA |
| | 13 | Ultrafilic | NA |
| Nano-filtration | 1 | Thin Film Polyamide | 0 |
| | 2 | Thin Film Polyamide | 0 |
| | 3 | Thin Film Polyamide | 0 |
| | 4 | Composite polyamide | NA |
| | 5 | Cellulose acetate | 0 |
| Reverse osmosis | 1 | Polyamide | 0 |
| | 2 | Polyamide | 0 |
| | 3 | Polyamide | 0 |
| | 4 | Polyamide | 0 |
| | 5 | Polyamide | 0 |
| | 6 | Thin film Polyamide | 0 |
| | 7 | Polyamide | 0 |
| | 8 | Polyamide | 0 |
| | 9 | Cellulose acetate | 0 |
| Forward osmosis | 1 | Polyamide | 0 |

In some embodiments of the present invention, the membrane consists of the dielectric material. However, in other embodiments, the membrane comprises other components in addition to the dielectric material.

In some embodiments, the dielectric material is uniformly, or substantially uniformly, distributed throughout the membrane. In other embodiments, the dielectric material is not uniformly distributed throughout the membrane. For example, in some embodiments, the membrane may comprise multiple layers or regions and the dielectric material is present only in some of those layers or regions, or is present in different proportions in different layers or regions.

In some embodiments, only a portion of the membrane is dielectric. Such membranes may be formed from membranes in which the dielectric material is located in a particular region or layer of the membrane.

In some embodiments, the electric field may be applied to only a portion of the dielectric material in the membrane, for example, the portion of the dielectric material located in a particular, region of the membrane. In some embodiments, only a portion of the membrane is heated when the electric field is applied.

Applying an Electric Field

In the present invention, in order to alter the characteristics of the membrane comprising the dielectric material, it is necessary to apply an electric field in a direction out of the plane of the membrane to at least a portion of the dielectric material.

An intense electric field is typically applied to the dielectric material through the application of electric potential differences of large magnitude between the two sides of the membrane. In embodiments where the membrane is compressed between the electrodes used to apply the electric field, the electric field is applied in a direction substantially perpendicular to the plane of the membrane. As discussed previously, applying an electric field in a direction substantially perpendicular to the plane of the membrane causes at least some of the dielectric material (e.g. the chains of the dielectric polymer) to become aligned in the membrane in a direction out of the plane of the membrane. The microstructure of the membrane is thereby changed in the direction in which filtration will occur through the membrane.

The electric field can also be applied to the dielectric material using a Corona discharge. This technique does not require direct contact and eliminates the risk of electrical arcing, and provides an alternative to compressing the membrane between electrodes. Using Corona discharge may also be advantageous in some circumstances because it does not require metal electrodes to be deposited on the opposing surfaces of the membrane.

The magnitude of the electric field applied to the dielectric material in the membrane will depend on the nature of the dielectric material and can be determined by a person having appropriate skill in the art of this invention. In embodiments in which the dielectric material is a dielectric polymer, relatively stronger electrical fields are required to achieve dipole alignment of amorphous polymers.

The electric field may, for example, be applied to the dielectric material by applying a potential difference of from about 500 volts to about 2500 volts across the membrane. In some embodiments, the electric field may be applied to the dielectric material by applying a potential difference of from about 1000 volts to about 2000 volts, for example about 500, 700, 1000, 1500, 1700 or 2000V. Such voltages result in an intense electric field being applied to the dielectric material. The magnitude of the electric field depends on the applied voltage and the thickness of the membrane. For example, applying a potential difference of about 2000V to a membrane which is 100 μm thick results in an electric field of about 20 MV/m being applied.

The voltage applied to the electrodes and across the membrane is typically increased gradually from zero to the final voltage at a constant rate, for example at 20, 50 or 100 volts/min. Similarly, the voltage is typically reduced back to zero volts at a constant rate.

The membrane comprising the dielectric material is heated when the electric field is applied. Typically, the membrane is heated before the electric field is applied. For example, the process of poling a piezoelectric material involves heating the piezoelectric material before the electric field is applied.

When the dielectric material is a polymer, the membrane is typically heated from room temperature to a temperature higher than its glass transition temperature (Tg) but lower than its melting temperature (also known as its Curie temperature). The electric field is then applied to the heated membrane for a desired period of time, following which the membrane is allowed to cool to room temperature. Typically, the electric field is turned off only after the membrane has cooled to room temperature.

Usually, polarization is frozen in a dielectric polymer by cooling the polymer to below its Tg before removing the electric field. The amorphous phase supports the crystal orientation and the polarization is constant up to the Curie temperature for many years if the film is not readily affected by external influences.

The temperature to which the membrane comprising a dielectric material is heated will depend on the nature of the dielectric material and membrane and can be determined by a person having appropriate skill in the art of this invention. In some embodiments, the membrane comprising the dielectric material is heated to a temperature of from about 80° C. to about 150° C. (e.g. about 80° C. to about 100° C., about 100° C. to about 150° C. or about 120° C. to about 150° C.) when the electric field is applied.

The length of time for which the electric field is applied to the membrane comprising the dielectric material will also depend on the nature of the dielectric material and membrane and can be determined by a person having appropriate skill in the art of this invention. In some embodiments, the electric field is applied to the dielectric material for about 30 mins to about 8 hours (e.g. for about one hour to about 4 hours or for about 1 to about 2 hours).

Preferably, the relaxation times are optimized by controlling the temperature and electrical field is crucial to achieve the optimal dipole alignment. The operation temperature should be below the Tg in order to maintain a permanent polarization. Time, pressure and temperature can also contribute to relaxation of frozen-in dipoles in these polymers.

In some circumstances, it may be necessary to take certain measures to prevent electrical breakdown of the membrane during application of the electrical field. Electrical breakdown (i.e. arcing) is far more likely to occur when a high electrical field is applied to non-uniform or heterogeneously structured materials, such as porous membranes, than in homogeneous films. For example, pores in a membrane are structures through which electrical arcing can occur. The inventors have found that it may be necessary to adapt the techniques used for poling films in order to apply a high electrical field to a membrane.

The inventors have found that one method to prevent arcing during application of the electrical field involves the use of a top metal plate to clamp the membrane that is smaller than the membrane itself, and smaller than a bottom electrode. For example, if a 90*90 mm rectangular piece of a membrane was to be treated, it could be sandwiched between two rectangular electrodes with its smoother side facing upwards. To prevent electrical arcing, the top electrode in contact with the smoother side could be a 60*60 mm rectangle, whereas the bottom electrode could be 100*100 mm in size. The inventors found that this configuration prevented arcing from occurring around the edges of the membrane. However, this procedure only caused the portion of the membrane between the two metal electrodes that is situated under the smaller top electrode to be exposed to the electrical field. The overlapping area of the membrane between the two metal plate electrodes that was exposed to the intense electric field and hence contains the aligned dielectric material, may either be cut out for future use, or the entire membrane (consisting of an aligned portion and an un-aligned portion) be retained for future use.

The inventors expect that other techniques could be used to prevent arcing from occurring during this process. For example, the membrane could be soaked in a fluid, so that the fluid permeates the pores of the membrane, which is where arcing would typically be expected to occur. Suitable fluids include dielectric liquids or gases which have a high dielectric strength, for example, $SF_6$.

An exemplary process by which the characteristics of a membrane comprising a dielectric material are changed will now be described with reference to FIG. 1. A membrane 10 comprising a dielectric material was sandwiched between two electrodes 12, 14. To prevent electrical arcing, the top electrode 12 was bigger than the bottom electrode 14. The membrane 10 was then heated using a heating element 16 from room temperature to about 90° C., whilst the voltage applied to the electrodes was increased from zero to about 2 kV at a rate of about 50 V/min using a high voltage supply 18. The membrane was then kept at 85-100° C. with the voltage of 2 kV applied for about 2 hours, after which it was allowed to cool to room temperature in the electrical field. The high voltage supply 18 was then turned off and the overlapping area of the membrane between the two electrodes cut out for subsequent use.

The specific conditions (maximum voltage, temperature and time for which the membrane is exposed to the maximum voltage) which can be used to alter the characteristics of a variety of membranes are listed in the following table.

| Type | No. | Material | Applied voltage (V) | Applied temperature (° C.) | Time (hr) |
|---|---|---|---|---|---|
| Micro-filtration | 1 | PVDF | 2000 | 80-100 | 2 |
| | 2 | PES | 1000 | 80-100 | 2 |
| | 4 | Nylon | 700 | 80-100 | 1 |
| | | | 700 | 80-100 | 2 |
| | 9 | CA | 1000 | 80-100 | 2 |
| | | | 1000 | 120-130 | 2 |
| Ultra-filtration | 4 | PES | 1000 | 80-100 | 2 |
| | 9 | PVDF | 2000 | 80-100 | 2 |
| Nano-filtration | 3 | Thin Film Polyamide | 1500 | 80-100 | 2 |
| | 4 | Composite polyamide | 1500 | 80-100 | 2 |
| | 7 | NA | 1500 | 80-100 | 2 |
| Reverse Osmosis | 3 | Polyamide | 1500 | 140-150 | 2 |
| | 4 | Polyamide | 1500 | 140-150 | 1 |
| | | | 1500 | 140-150 | 2 |

The listed temperature for each of the dielectric materials set out in the table is higher than its glass transition temperature and lower than its melting temperature.

Piezoelectric Materials

Piezoelectric activity can be induced in a membrane comprising a piezoelectric material by heating the membrane to a temperature below the Curie temperature or melting point of the membrane material(s) and applying an electrical field across the membrane. Poling conditions (such as voltage, current, time and temperature) will need to be optimized for particular piezoelectric materials and to prevent structural defects from developing in the membrane as a result of molecular re-orientation in the intense electrical fields, and to prevent arcing during the poling process.

In embodiments in which the dielectric material is a piezoelectric material, as a result of the poling process (e.g. in a direction substantially perpendicular to the membrane), the resulting membranes will exhibit piezoelectric properties. The membranes will thus Undergo mechanical deformation in the transverse direction (i.e. out of the plane of the membrane) upon the application of an electric potential across the membrane. The inventors have found that this property can be used in membrane separation systems to reduce fouling of the membrane. The fabrication and characterization of membranes with inherent piezoelectric capabilities has potential to overcome the most substantial and costly impediment to the development of membrane technology, fouling.

The piezoelectric properties of piezoelectric materials generally only manifest after the electric dipoles of the piezoelectric material are aligned. This alignment may be achieved by applying an intense electric field to the material, by stretching/extrusion of the material or by corona poling. In the case of electrical poling, the degree of alignment and hence the piezoelectric sensitivity is dependent on the intensity of the electric field as well as the temperature used (the temperature is usually just below the melting point of the material). Upon cooling, the electric dipoles remain aligned, even after the removal of the electric field. This process is referred to as "poling".

Any piezoelectric material (i.e. any material capable of being poled to yield a piezoelectrically-active material) suitable for use in a membrane can be used in the present invention. Typically, the piezoelectric material will be a piezoelectric polymer, however, membranes can also be formed from piezoelectric inorganic materials (e.g. piezoelectric ceramic materials), such as those listed above, or from a composite of polymers and inorganic materials.

Examples of piezoelectric polymers suitable for use in the present invention include polyvinylidene fluoride (PVDF) and its copolymers such as poly (vinylidene-triflouroethylene), poly amides such as nylon-7, nylon-11 and nylon-6, poly(vinyl chloride), poly(acrylonitrile), poly(vinyl acetate) and its copolymers such as poly(vinylidenecyanide-vinylacetate), vinylidene cyanide copolymers with monomers such as vinyl benzoate and methyl methacrylate, poly(phenylethernitrile), nitrile-substituted polyimides such as poly(bicyclobutanecarbonitrile), poly-($\alpha$-hydroxy acids) such as poly-(lactide) and its copolymers and poly-(glycolides) and its copolymers, collagen, polypeptides such as poly-g-methylglutamate and poly-g-benzyl-L-glutamate, DNA, chitin and chitosan. Combinations of these piezoelectric polymers can also be used in the present invention.

Vinylidene fluoride has been copolymerized with both fluorocarbon and non-fluorocarbon monomers. The most common co-monomers are trifluoroethylene (TrFE) chlorofluoroethylene (CTFE), tetrafluoroethylene (TFE), hexafluoropropylene (HFP), hexafluoroisobutylene, and pentafluoro-propene. P(VDF-TrFE) and P(VDF-TFE) are more common because of their enhanced piezoelectric properties compared to PVDF itself. P(VDF-TrFE) and P(VDF-TFE) have been shown to exhibit strong piezoelectric, pyroelectric and ferroelectric properties. P (VDF-HFP) and P(VDF-CTFE) are commercially available and are used as a more chemical resistant, flexible alternative to PVDF in applications such as piping and coatings.

Piezoelectric polymers such as poly-vinidylfluoride (PVDF) and poly amide (Nylon) and others, can be poled to yield piezoelectrically-active materials. Piezoelectrically-active materials are used in transducers, microphones, loudspeakers and actuators. PVDF is used in electrical applications (e.g. in fabricating transducers, sensors and other electro-mechanical elements) due to its piezoelectric properties. PVDF films for such electrical applications are usually produced by processes such as extrusion and are not suitable for use as membranes.

PVDF is also used in membrane separation processes due to its superior chemical and thermal resistance. However, PVDF membranes prepared using conventional processes such as solvent Casting are not piezoelectrically active. In order for a PVDF film or membrane to be made piezoelectrically active, the crystalline structure of the semi-crystalline polymer needs to be changed from non electro-active configurations (alpha, gamma and delta) to piezoelectrically active all-trans (beta) structure, which cannot be achieved under normal conditions because of thermodynamic limitations.

The piezoelectric properties of poled membranes were examined by measuring their piezoelectric coefficient (D33), dynamic mechanical analysis (DMA) and electrical impedance spectroscopy. Experiments performed using piezoresponse force microscopy (PFM) and surface displacements measured using laser doppler confirmed the piezoelectric activity of the membranes. Vibration measurements performed in air and water showed that the water did not dampen the piezoelectric vibration to any significant extent, and the vibration increased strongly with increasing AC or DC signal amplitudes.

In order to investigate the effect of piezoelectric activity of the membranes on their filtration performance, a cross flow membrane module containing two porous steel electrodes were used and AC signals at different frequencies were applied to the membrane during filtration. These experiments showed that exciting the fabricated piezoelectric membranes increased the average flux and delayed membrane fouling significantly. Further, increasing the cross flow rate boosted the antifouling effect of the piezoelectric vibration (see Examples 6 and 7).

Membrane Separation Systems and Apparatuses for Separating One or More Components from a Fluid The present invention also relates to membrane separation systems and apparatuses utilizing the membranes of the present invention to separate one or more components from a fluid. The systems and apparatuses comprise a membrane separating a fluid inflow region and a fluid outflow region, with at least a portion of the membrane comprising a dielectric material, where at least a portion of the dielectric material is aligned in a direction out of the plane of the membrane (e.g. substantially perpendicular to the plane of the membrane). The membrane is selected such that the membrane is more permeable, or, more typically, less permeable, to the one or more components than to other components of the fluid. Typically, the membrane is selected such that the membrane is less permeable to the one or more components than to the fluid in which the one or more components are dissolved or suspended.

In some embodiments, the dielectric material is a piezoelectric material having a direction of poling whereby application of an electric signal to the membrane causes out of plane movement of the membrane. As discussed above, piezoelectrically-active materials are mechanically deformed when an electric potential is applied to the material, for example to opposing surfaces of the material or across the material.

The piezoelectric properties of the membrane of the present invention enables the membrane to be mechanically deformed through the application of alternating electric potentials that cause vibration in a direction out of the plane of the membrane (e.g. normal to the membrane if the piezoelectric material has been poled in a direction substantially perpendicular to the plane of the membrane). That is, the membrane is caused to alternatively contract and expand in thickness, which will have at least two major effects as described below.

Firstly, vibration normal to the membrane surface would induce micro-agitation of the otherwise unstirred boundary layers at the fluid-membrane interface where retentate can accumulate and foul the membrane. Diffusion polarization effects in this boundary layer accentuate the accumulation and are a major contributor to the power required to maintain a prescribed flux output. The micro-agitation can therefore prevent or reduce fouling of the membranes. In a cross-flow feed system in which foulant that accumulates near the surface of the membrane is swept away, the micro-agitation would be expected to enhance the effectiveness of the cross flow, and hence the tendency for fouling to occur would be further decreased.

Secondly, the vibration of the membrane may assist in the passage of the permeate through the membrane, by reducing the drag forces between the permeate and the membrane material.

In operation of the system or apparatus of the present invention, feed fluid is driven under pressure onto one side of the membrane, whilst the permeate is collected from the other side. The system or apparatus may further comprise electrodes for applying an electric signal to the membrane. The electrodes may, for example, be provided embedded in the membrane module (the part of the system or apparatus comprising the membrane) and electrically connected to electrode terminals on the outside of the pressure vessel that encompasses the membrane module so that mechanical deformation of the membranes can be activated from the outside by the application of an AC potential to these electrode terminals. Piezoelectric deformation (i.e. the expansion and contraction of the piezoelectric material) of the membrane occurs when an electrical signal is provided by the electrodes.

The electrodes should be constructed from a material that is a conductor of electricity. Preferably, the electrodes and the electrode leads that are accessible from the outside of the module should be constructed out of the same material to avoid complications that may arise from electrochemical reactions between different components when they are immersed in fluids.

The leads connecting the electrodes to the outside of the module should preferably be covered or coated with an electrically insulating material so that only the electrodes themselves are exposed to the fluids.

The electrodes used to apply the stimulus signal would typically extend over the entire length of the membrane, in order for all of the piezoelectric material in the membrane to be activated by the application of the signal.

The electrical signal applied to the electrodes is typically periodic, for example, sinusoidal, triangular or square waveforms (or combinations of these waveforms), and is of sufficient amplitude and at a frequency suitable to induce the mechanical deformation of the piezoelectric portions of the membrane.

Figure 2:
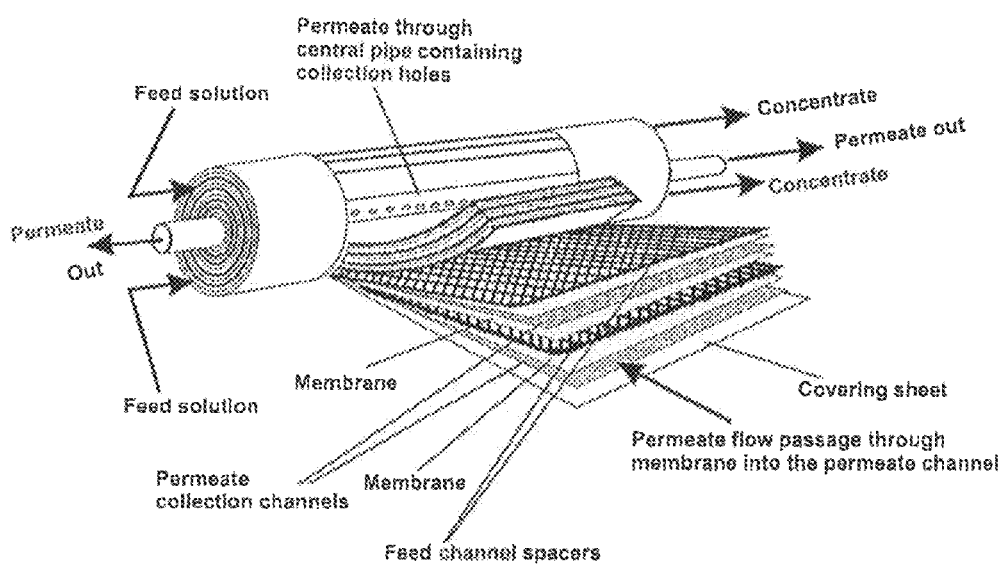
FIG. 2 is a schematic diagram illustrating the basic structure of a prior art "Spiral wound" membrane module (in the drawing, part of the module is shown "unwound" to indicate how the membrane is configured)

The overall operational capacity of a membrane increases with surface area. Accordingly, membranes are typically provided in the form of replaceable modules in which the membrane, or multiple membranes, is/are configured to provide a suitable surface area. The membrane separating system and apparatus of the present invention may also be provided in the form of, or incorporate, replaceable modules comprising the membrane. In one of the most common module configurations, the ratio of the membrane area to the volume of the module is maximized by wrapping the membranes into a spiral around a central permeate collection tube. In these so called "Spiral Wound" modules, the membrane surfaces are kept apart by a spacer usually made of polymer strands. The spacers define channels on either side of the membranes, through which inflow fluid, retentate and permeate can flow. An illustration of the internal structure of a spiral-wound membrane module is shown in FIG. 2.

In the spiral-wound membrane module, the permeate moves radially towards the centre along the spacer between adjacent membranes to the central permeate collection tube. The feed fluid moves between, adjacent membranes, longitudinally along the module. This also provides a so called "cross-flow" that assists in preventing fouling of the membranes. The spacers are usually constructed from thick (millimeter) polymer threads made into a fabric.

In some embodiments of the present invention, the membrane separation system and apparatus can be provided in the form of, or incorporate, a spiral wound module. It is envisaged that the spacers can be made of an electrically conducting material (such as a metal) and used as electrodes to which AC or other electrical voltages can be applied to the membrane in order to piezoelectrically vibrate or deform the membrane, as discussed above. The electrode configurations of such embodiments are depicted in FIGS. 3 to 5.

Figure 3:
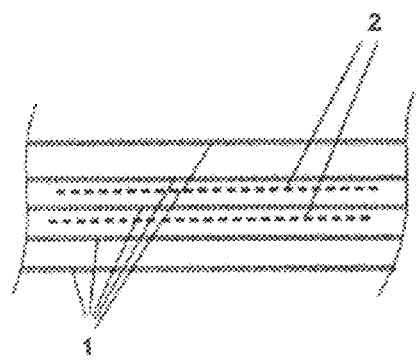
FIG. 3 is a schematic diagram illustrating a cut-away view of the membranes and electrode spacers of an embodiment of a spiral-wound membrane separation module of the present invention.

FIG. 3 shows a cut-away view of the membranes (1) and electrode spacers (2) of a spiral-wound membrane separation module. The cut-away membrane and electrode spacers are here shown unrolled for simplicity to reveal the internal arrangement of the components. The drawing illustrates a system with in which electrode spacers (2) are located on the two sides of a single membrane (1).

Figure 4:
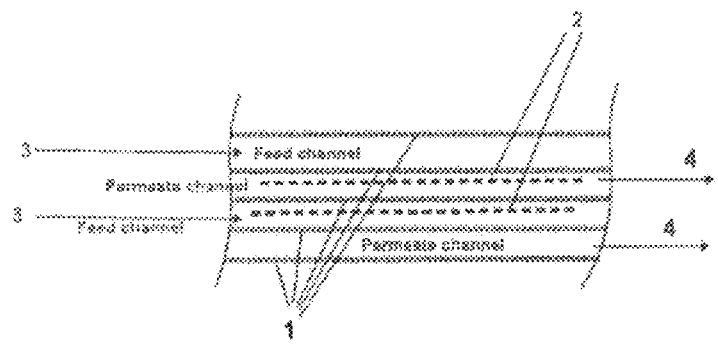
FIG. 4 is a schematic diagram illustrating a cut-away view of another embodiment of a membrane separation module of the present invention.

FIG. 4 shows four membranes (1) having a feed fluid channel on one side (3) and a permeate fluid channel on the other side (4). Electrodes (2) are shown located on two sides of a single membrane with one electrode being in a feed fluid channel and the other in the permeate fluid channel.

It is also possible to locate the electrodes in such systems and apparatus such that the stimulus or driving signal is applied to two membranes in series. This would involve placing the electrodes in either two feed side channels separated by two membranes and a permeate channel, or placing the electrode pairs in two permeate side channels separated by two membranes and a feed side channel. Piezoelectrical deformation is then effectively caused to both membranes in series (and at the same time). This configuration is shown in FIGS. 4A and 4B.

In particular, FIG. 5A shows two electrodes (2) located in two feed fluid channels (3) and separated by two membranes and a permeate fluid channel (4).

FIG. 5B shows two electrodes (2) located in two permeate fluid channels (4) and separated by two membranes and a feed fluid channel (3).

Typically, the electrodes embedded in the membrane module are electrically connected to electrode terminals on the outside of the pressure vessel that encompasses the membrane module. This enables the membranes to be activated from the outside by the application of an AC potential to these electrode terminals. Piezoelectric vibration/deformation of the membrane will occur when electrical signals are applied to the electrodes embedded in the module. This is illustrated in FIG. 6, which depicts how the application of electrical signals to the electrodes would cause the membrane to vibrate or undergo other internal deformations, as discussed above.

FIG. 6 depicts a specific embodiment of a module (7) in which the electrode spacers (2) are located in adjacent feed channels (only two pairs of such electrodes are shown). Alternate electrode spacers (2) are electrically connected together, and via electrical conductors (6) to a wave form generator (5) that produces an alternating voltage of suitable frequency and magnitude to cause piezoelectric excitation (i.e. expansion and contraction) of the membranes (1). Connection to the electrodes in the module (7) for the other configurations described above would be similar.

In alternate embodiments, separate electrodes may be embedded in the otherwise electrically non-conducting spacer fabric on each side of the membrane. Alternatively, the electrodes could be sputter coated as an ultrathin layer on opposite surfaces of the membrane or be provided in the form of conducting polymer layers that are incorporated into the membrane structure during manufacture.

There may be some advantage in applying the AC voltage to piezoelectrically activate the membranes in the configuration in which both electrodes are present in the same solution, that is both electrodes are placed in either the feed solution or the permeate solution. This is because when such electrodes are in solutions on either side of the membrane the electrochemical processes at the electrode-solution interfaces may create electric potentials that interfere with the separation process or create undesirable electrolytic effects.

It will be appreciated that other configurations of membrane modules currently in use could be adapted to perform the present invention.

One such known configuration is the so-called "Flat bed membrane module" (not shown). The placement of electrodes on two sides of the membrane, using the various configurations described above, is also possible for such systems and from a manufacturing perspective would, be simpler than for a spiral-wound membrane module.

In some membrane modules, the membranes themselves are cylindrical in shape and electrodes can be readily placed in such modules on the opposite sides of these membranes.

It is expected that the electrode configurations described above could readily be incorporated into the "Flat bed" and "Cylindrical" membrane modules. Such electrodes would allow the piezo-electric excitation of these membranes in the same manner as described above.

Another form of membrane module utilizes so called "Hollow fibre" membranes. These "hollow fibre" membranes consist of fine fibres, typically of approximately 1 mm in diameter which have a central void surrounded by material which itself is the membrane. Bundles of such hollow-fibres are usually incorporated in a complete module. The incorporation of electrodes outside the hollow fibre would be relatively easy to manufacture. Whilst it may be technically difficult to insert electrodes inside such hollow fibres without impeding the flow of fluid along its axis, the piezoelectric activation of the membrane as described above would still be expected to occur once suitable electrodes were in place.

EXAMPLES

Example 1

Applying an Electric Field in a Direction Out of the Plane of a Membrane Comprising a Dielectric Material The production of a poled PVDF membrane by poling a conventional PVDF membrane in an intense electrical field (~163 MV/m) will now be described. The PVDF membrane used in this study was Pall Fluoro Tran® W supplied by PALL Life Sciences (Australia). The thickness and nominated pore size of this film were 123 and 0.22 microns, respectively.

The membrane was sandwiched between two electrodes. To prevent electrical arcing, the top electrode was bigger than the bottom electrode. The membrane was then heated from room temperature to 90° C., whilst the voltage was increased gradually from zero to 2 kV at the rate of 50V/min. The membrane was kept at 85-100° C. with a voltage of 2 kV applied for 2 hours, and then allowed to cool to room temperature in the electrical field. Once the membrane had cooled to room temperature, the voltage between the electrodes (and hence the electric field applied to the membrane) was gradually reduced back to zero. The portion of the membrane located between the two electrodes and which was exposed to the high voltage electrical field was then cut out and used as the poled membrane in the experiments described below.

A number of different techniques can be used to detect and measure the piezoelectric responses of piezoelectric ceramics and polymers, including by using a d33 meter. The piezoelectric responses of the PVDF film prepared as described above and a PVDF membrane that had not been poled were determined using a Berlincourt D33 meter to be 18±4 and 1.5±0.5 pC/N, respectively. The significant differences between the poled and the un-poled membranes show that the polling process was successful and the poled sample was piezoelectrically active.

A d33 meter is not able to measure the distribution of the piezoelectric portions of the poled membrane so a piezoresponse force microscope (PFM) was used to investigate the piezoelectric properties of the poled PVDF membrane. A multimode atomic force microscope (AFM) with Pt/Ir coated cantilever (with typical tip radius of 7 nm, force constant of 0.2 N/m, and resonant frequency of 13 kHz) was employed at a scan rate of 0.8 Hz to visualize the domain structure. An AC signal of amplitude between 3 and 5 V and frequency of 7 kHz was applied between the tip (of the movable top electrode) and the bottom electrode of the sample to acquire the vertical PFM (VPFM) and lateral PFM (LPFM) images.

By comparing the out-of-plane images of the un-poled and poled PVDF membranes, it was seen that un-poled PVDF membrane has a very weak contrast over the measuring scale of 8 $\mu m^2$, whilst the poled PVDF membrane has a range of contrasts, indicating various d33 values. These PMF images indicate that the polarization which occurred during the poling processes was in the same direction in all parts of the membrane and confirm that the un-poled sample was not piezoelectrically-active while the poled sample was able to convert the applied electrical energy to mechanical vibration.

Scanning Electron Microscopy (SEM) images showed that poling in an intense electrical field changed the microstructure of the membrane dramatically (see Example 2, below).

The poled PVDF membrane prepared as described above could be used in conventional membrane separation systems in place of prior art, non-piezoelectrically-active PVDF membranes. The separation performance of these membranes was investigated using aqueous solutions of sodium alginate with different molecular weights and bovine serum albumin solutions. The membrane was found to be capable of separating such substances.

A similar technique was used to apply an electrical field and thus align at least some of the polymer chains in a micro-filtration membrane made from polyethersulfone (PES). PES is not a piezoelectric polymer, but is a dielectric polymer. In sort, the PES membrane was heated to a temperature of about 90° C., whilst the voltage applied to the electrodes on either side of the membrane was increased gradually from zero to 1000V at the rate of about 50V/min. The membrane was kept at 80-100° C. with the voltage of 1000V applied for 2 hours, and then allowed to cool to room temperature in the electrical field.

A similar technique was used to apply an electrical field and thus align at least some of the polymer chains in a reverse osmosis membrane made from polyamide. In sort, the PA membrane was heated to a temperature of about 140° C., whilst the voltage applied to the electrodes on either side of the membrane was increased gradually from zero to 1500V at the rate of about 50V/min. The membrane was kept at 140-150° C. with the voltage of 1000V applied for 1-2 hours, and then allowed to cool to room temperature in the electrical field.

Example 2

Differences in the Characteristics of Poled and Un-Poled PVDF Membranes

The microstructure (both in cross-section and on the surface) of PVDF micro-filtration membranes with an average pore size of ~0.2 micron was examined with a Field Emission Scanning Electron Microscope (Zeiss, ULTRA plus), equipped with a Schottky field emission gun (10 kV) both before and after electrical poling as described in Example 1, as well as after the filtration tests described below.

Cross sectional SEM images of the microstructures of the membranes reveal that poling for 2 hours changed the microstructure of the membrane dramatically; from essentially isotropic to strongly anisotropic. The images before poling are consistent with a membrane having interconnected open pores that are homogenously distributed. However, the images after poling show that the poled membrane comprises many repeats of three distinctive layers of differing electron density that are indicative of amorphous, crystalline and porous properties. The multilayered structure indicates that the massive electrical field stretched the PVDF polymer chains at a poling temperature of 90° C., which is midway between the glass transition temperature for this polymer (−35° C.) and its melting temperature (177° C.). The inventors believe that fluorine groups of the PVDF chains rotate to align with the intense electric field, which is consistent with conventional processes for converting other types of PVDF crystals to the β (piezoelectric) form. The cross-sectional images revealed that the amorphous and crystalline layers contained pores.

These results demonstrate that electrical poling can be used as an alternative or in addition to other more sophisticated techniques developed to fabricate multilayered membranes having altered characteristics.

The surface topographies of the PVDF microfiltration membranes were characterized with a Nanoscope III Multimode Atomic Force Microscope (Veeco, Santa Barbara, Calif.), operated in the contact mode at a scan rate of 1.05 Hz. Nanoscope (version 530r3sr3) software was used to analyse the sections of the images and characterize the roughness of the membrane surfaces.

In contrast to the cross-sectional SEM images discussed above, the SEM images of the skin layer of the PVDF membrane before and after electrical poling show minimal differences. However, the histogram of the skin layer images and viewing the skin layer images at a higher magnification show that pores on the surface of the poled membrane were more regularly shaped, and principally aligned perpendicular to the membrane surface. In contrast, pores on the surface of the un-poled membrane were smaller, less regularly shaped and more interconnected.

The effect of electrical polling on the separation performance of the PVDF membranes was then investigated. The filtration performance of PVDF micro-filtration membranes, both before and after electrical poling was compared using a dead-end filtration module. In this chamber, a 19.6 $cm^2$ area of the membranes was exposed to water or a solution containing 10 g/liter of sodium alginate. Pressure (55 kPa) was applied using compressed air and maintained at a constant value using a pressure regulator. A magnetic stirrer was used to prevent the accumulation of solute molecules onto the membrane surfaces and minimize concentration polarization effects.

The filtrate was collected in a reservoir placed on an electronic balance (Shimadzu Corp.), which measured the mass of the permeate. The permeate fluxes of the poled and un-poled PVDF membranes were thus able to be calculated by recording the mass as a function of time. Alginate concentration in the permeate solution from the poled and un-poled membranes were calculated by drying the permeate solution and weighing the dry content of the solution.

When pure water was being filtered, the permeate flux for the poled membrane was found to be generally less than that for the un-poled membrane, which is probably due to the dramatic microstructural changes arising from poling as discussed above. The reduction in flux for both membranes was approximately 20% in the first 2 minutes, but then stabilised at approximately 5% as the water flux approached a steady state, which indicates that the membrane's porosity was probably only marginally lowered by poling.

However, when sodium alginate at a concentration of 10 g/l was introduced to the feed solutions, a substantial reduction in the permeate fluxes occurred for both the poled and un-poled membranes. Both membranes exhibited similar initial flux declines to those described above during the filtration of water, but the fluxes for the poled and un-poled membranes with sodium alginate in the feed solution did not converge to separate values approaching the steady state. Indeed, exponential fits to both sets of filtration data predict that the fluxes the poled and un-poled membranes would convergence after about 35 minutes of filtration. The inventors' postulate that this implies that microstructural changes caused by poling have changed the pore size of the membrane and/or that the poled and un-poled membranes become fouled differently.

The concentration of sodium alginate in the permeate solutions for the poled and un-poled membrane was then calculated and compared with the concentration of sodium alginate in the feed solutions (i.e. 10 g/l). The concentration of sodium alginate in permeate from the un-poled PVDF membrane was about 9.5 g/l, whereas the concentration of sodium alginate in the permeate from the poled PVDF membrane was about 5 g/l. This indicates that the poling process causes the membrane to have a substantially narrower molecular weight distribution, as well as reducing its molecular weight cut-off.

The microstructures (both in cross-section and on the surface) of the poled and un-poled membranes, after they had been used to filter the sodium alginate were then investigated using SEM micrographs. These images indicate that different filtration mechanisms are likely to be occurring in the poled and un-poled membranes.

In summary, this Example demonstrates that application of an intensive electrical field to a micro-filtration PVDF membrane for 2 hours dramatically changed its microstructure from an anisotropic interconnected morphology to a multilayered structure. Poling also significantly changed the filtration performance of the membrane, in particular, the MWCO performance of the poled membrane was considerably better than that of the un-poled membrane.

Example 3

Differences in the MWCO Properties of Micro-Filtration Membranes to which an Electric Field has and has not been Applied In order to investigate the effect that an intense electrical field has on the filtration performance of micro-filtration membranes, two membranes with 0.2 micron average pore size were subjected to a high electric field whilst being heated and their filtration performance was examined and compared with membranes made of the same material but which had not been subject to the intense electric field: The selected membranes were made of poly(vinylidene fluoride) (PVDF) and poly(ether sulfone) (PES).

A high pressure dead-end filtration module was used in this study. The filtration apparatus was a stainless steel dead-end stirred cell (HP4750 Stirred Cell, Sterlitech Corp., Kent, Wash.), resting on a magnetic stir plate. The effective membrane area was 13.85 cm$^2$. The feed chamber was pressurized to 200 KPa using nitrogen gas. An aqueous solution (1 wt %) of polyethylene glycol (PEG) with an average molecular weight of 100 KD was provided as the feed solution, and the permeate flux was estimated from the mass of permeate collected in a container resting on an electronic balance.

PVDF Membrane

After about an hour of filtration, the mass of permeate using the un-poled PVDF membrane was almost 100% greater than that for the poled PVDF membrane. The flux of the poled membrane was significantly smaller than that of the un-poled membrane. The water flux across the poled membrane was slightly greater than that of the un-poled membrane. After the filtration tests were completed, the molecular weight of the PEG in the dried feed and permeate solutions was measured using Gel Permeation Chromatography (GPC), and compared to determine the molecular weight cut off (MWCO) of the membranes using PEG solutions.

The distribution of molecular weight of the PEG in the permeate solution of the unpoled membrane was narrower than that of the PEG in the feed solution. The distribution of the molecular weight of PEG in the permeate of the poled membrane was significantly narrower than that in the permeate of the un-poled membrane. This demonstrates that electrical poling can significantly decrease the MWCO of a PVDF micro-filtration membrane.

PES Membrane

The same experiments were performed on PES micro-filtration membranes, one of which had been exposed to an electric field as described in Example 1. After about an hour of filtration, the mass of permeate from the standard membrane was almost 300% greater than the mass of permeate from the PES membrane that had been exposed to the electric field. The flux of the membrane that had been exposed to the electric field was significantly smaller than that of the standard membrane, while the water flux was slightly greater.

These results suggest that exposing the PES membrane to an electric field has a similar effect to that observed for the PVDF micro-filtration membranes. Even though the electrical field applied to the PES membranes was smaller than that applied to the PVDF membranes, the deformation and alignment of the pores appeared to be greater in the PES membrane. This might be due to the tower mechanical modulus of the PES compared with the PVDF membrane.

In summary, based on the results of the experiments discussed in this Example, it can be concluded that an intense electrical field can alter the microstructure of different types of membranes comprising dielectric materials. It can also be concluded that such treatment of microfiltration membranes could be used to improve the molecular weight cut off (MWCO) of the microfiltration membranes.

Example 4

Differences in the Characteristics of Poled and Un-Poled PVDF Ultra-Filtration Membranes PVDF ultra-filtration membranes were poled using the same conditions as described above in respect of the PVDF micro-filtration membranes. The characteristics of the poled and un-poled membranes were then compared in filtration tests. A 5 wt % solution of 35 KD PEG was filtered at 30 psi (~207 kPa) using the poled and un-poled PVDF ultra-filtration membranes, using techniques similar to those described in Examples 2 and 3.

The cumulative permeate weights and the fluxes of the poled and un-poled PVDF ultra-filtration membranes were measured. After about an hour of filtration, the permeate mass using the un-poled membrane was almost 50% greater than the permeate mass from the poled PVDF membrane. The flux of the poled membrane was significantly lower than that of the un-poled membrane, whilst the water flux across the poled membrane was slightly greater than that of the un-poled membrane.

These results are in agreement with the results obtained for the PVDF micro-filtration membranes, and indicate that applying an electric field can also change the microstructure of ultra-filtration membranes and change their molecular weight cut (MWCO) characteristics.

Example 5

Differences in the Properties of Reverse Osmosis Membranes to which an Electric Field has and has not been Applied Two low-pressure (1000 KPa) reverse osmosis membranes were selected to investigate the effect that applying an electrical field has on the filtration performance of reverse osmosis membranes. The membranes selected were the 70UB polyamide reverse osmosis membrane ("RO-3") and the 70B polyamide reverse osmosis membrane ("RO-4"), obtained from Toray Industries, Inc.

Two RO-3 membranes and three RO-4 membranes were used in this Example. One of the RO-3 membranes was subjected to an electric field by applying about 1500V across the membrane whilst the membrane was heated to a temperature of about 150° C. for about 2 hours, as described in Example 1. The other RO-3 membrane (the "standard membrane") was used as provided by the manufacturer. One of the RO-4 membranes was subjected to an electric field by applying about 1500V across the membrane whilst the membrane was heated to a temperature of about 150° C. for about 1 hour. Another of the RO-4 membranes was subjected to an electric field by applying about 1500V across the membrane whilst the membrane was heated to a temperature of about 150° C. for about 2 hours. The final RO-4 membrane (the "standard membrane") was used as provided by the manufacturer.

The salt rejection characteristics of the membranes were compared because this is a very important characteristic of reverse osmosis membranes. Two salts with different molecular weights (sodium chloride, MW=58.443 g/mol and magnesium chloride ($MgCl_2.6H_2O$), MW=203.31 g/mol) were used to investigate the effect that applying the electric field has on rejection of the reverse osmosis membranes. Filtration tests were performed using distilled water; 100 mM NaCl solution; and 50 mM $MgCl_2$ solution.

RO-3 Reverse Osmosis Membranes

The steady state water flux across the RO-3 membrane to which the electric field had been applied was found to be almost 10 times lower than that of the standard RO-3 membrane. The permeate mass after about 19 hours filtration using the standard membrane was at least 2 times greater than for the membrane to which the electric field had been applied. At an early stage of filtration, the flux of the membrane to which the electric field had been applied was about 8 times lower than for the standard membrane, but towards the end of the experiment, the flux of two membranes approached the same level because the flux decline for the standard membrane was much faster. After about 1.5 hours, the standard membrane was fouled, while the flux of the membrane to which the electric field had been applied was almost half of its initial maximum flux. A delay in fouling is a considerable advantage of the membranes to which the electric field had been applied.

Using $MgCl_2$ as the model salt produced somewhat different results. The permeate mass of the standard membrane was found to be significantly greater during the early stages of filtration, but the permeate mass of the membrane to which the electric field had been applied approached the same level as that of the standard membrane after a while. At the end of the experiment, the mass of permeate obtained from the membrane to which the electric field had been applied was greater.

The flux of the standard membrane was found to be almost three times higher at the beginning of test, but declined to about half of the membrane to which the electric field had been applied by the end of the experiments. The normalized flux data showed that the standard membrane was almost blocked 6 hours after beginning of the filtration test, while the membrane to which the electric field had been applied retained almost 30% of its initial flux.

The $MgCl_2$ salt rejection of the membrane to which the electric field had been applied was about 60% higher than that of the standard membrane. This suggests a positive effect of poling on delayed fouling. Salt rejection could be more obvious if bigger molecules or salts are used.

RO-4 Reverse Osmosis Membranes

The steady state water flux across the RO-4 reverse osmosis membranes to which the electric field had been applied was smaller than that of the standard RO-4 reverse osmosis membrane. At the beginning, the membrane to which the electric field had been applied for 2 hours showed a slightly higher water flux, probably because it has a lower compression modulus and the compressing effect of the water was greater for this membrane. Generally the water fluxes of the three membranes were close and the big difference observed in respect of the RO-3 membranes was not noticeable.

The filtration performance of the three membranes was compared using 100 Mm NaCl as the feed solution. The permeate mass of the membrane to which the electric field had been applied for 2 hours was greater than that for the standard membrane. The permeate mass of the membrane to which the electric field had been applied for 1 hour was slightly lower during the early stages of filtration, but by the end of the experiment it had approached a slightly higher level than for the standard membrane.

The fluxes of the standard membrane and the membrane to which the electric field had been applied for 1 hour was similar, while the membrane to which the electric field had been applied for 2 hours had an almost three times higher flux at the beginning of the experiment. By the end of the experiment, however, this had approached the same level as for the other membranes. The NaCl salt rejection of membranes to which the electric field had been applied was lower than that of the standard membrane, which suggests that non-structural defects are produced in the membrane as a result of the electrical field. The membrane to which the electric field had been applied for 1 hour had a 100% improved salt rejection over the membrane to which the electric field had been applied for 2 hours.

The filtration performance of the three membranes was also compared using 50 Mm MgCl$_2$ as the feed solution. A similar scenario to that described above where the feed solution included NaCl observed, with the only obvious difference being that the membrane to which the electric field had been applied for 1 hour retained almost 80% of its initial flux after 17 hours filtration, while the flux of the standard membrane and membrane to which the electric field had been applied for 2 hours were only about 30% of their initial fluxes. Delayed fouling, which was observed in the previous experiment performed on the RO-3 membranes, can be considered as one of the advantages of electrical poling.

The MgCl$_2$ salt rejection of the membrane to which the electric field had been applied for 2 hours was about 30% lower than for the standard membrane, while the rejection of the membrane to which the electric field had been applied for 1 hour was only 17% lower than for the standard membrane. This suggests that a large portion of the nanodefects generated during application of the electrical field were smaller than the size of MgCl$_2$, because the difference in salt rejection was much greater when NaCl was filtered using these membranes.

These experiments indicate that the microstructure of the RO-4 membrane is more sensitive to the internal forces generated by the electric field. The lower modulus of this membrane compared with the RO-3 membrane could also be the cause of this difference.

In summary, treating reverse osmosis membranes comprising a dielectric material in an intense electric field can alter the characteristics of the membrane, but the poling time may need to be controlled to provide benefits such as higher salt rejection and delayed fouling.

Example 6

Antifouling Properties of Poled PVDF Membranes

This example demonstrates the ability of the poled PVDF membrane described in Example 1 to resist fouling.

A cross flow membrane test module with an effective membrane area of 36.08 cm$^2$ was used to investigate the effect of the piezoelectric activity on membrane filtration. Two 15×120 mm porous steel electrodes were imbedded on both side of the membrane in the cross flow module as electrodes. These electrodes eliminate the need for coating the membrane with a conductive material such as gold and the bottom electrode also functions as a membrane support. On both sides of the cross flow module, compressed air at 175 kPa pressure was used to pump the feed solution to the module.

The permeate was collected in a reservoir placed on an electronic balance (Shimadzu Corp.) and its weight recorded. The cross flow was adjusted using a valve, and a positive displacement pump was used to keep the cross flow constant. The cross flow mass was monitored using a digital balance. The membrane was pre-wetted for one hour in ethanol followed by one hour in distilled water. Polyethylene glycol (PEG) of average molecular weight 100 KD was used a model feed, and a solution of 1 wt % PEG in distilled water was used in the filtration tests. A sinusoidal shaped signal with 9.5 volts AC amplitude and 17 volts DC offset at three different frequencies (5, 322 and 3000 Hz) was applied to the membrane during the filtration and separation processes.

Firstly, the effect that applying electric signals to the un-poled PVDF membrane had on the filtration performance of that membrane was investigated. It was found that applying electric signals did not change the accumulative weight and flux of the permeate significantly. The electrical signals did not affect the fouling behavior of the un-poled membrane, nor change the normalized flux. Finally, measuring the dry content of the filtrate at the end of the experiment also revealed that applying electrical currents did not affect the rejection of the un-poled membrane. These experiments confirm that applying electrical signals does not affect the filtration properties of un-poled membranes. Thus, it can be inferred that any change in the filtration properties following poling of the membrane is related to its piezoelectric properties.

Figure 7:
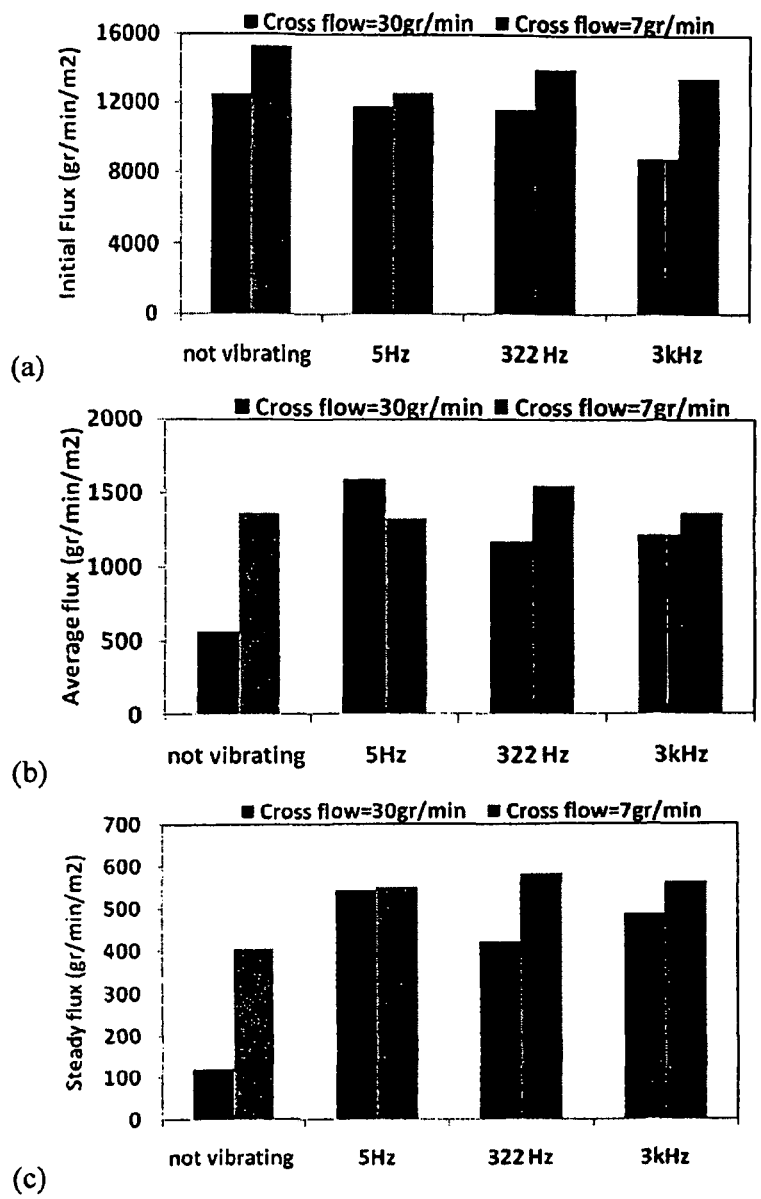
FIG. 7 shows graphs tabulating the (a) initial flux, (b) average flux and (c) steady state flux through poled PVDF membranes to which is applied an electrical signal at a frequency of 0 Hz, 5 Hz, 322 Hz or 3 kHz, with a cross flow of 30 gr/min or 7 gr/min.

The normalized flux of filtrate through the Doled membrane, both without and with applying an electric signal (at frequencies of 0 Hz, 5 Hz, 322 Hz and 3 kHz) was then compared. The cross flow over the membrane in all experiments was either about 7 gr/min or about 30 gr/min. The results of these experiments are shown in FIG. 7.

The normalized flux of the membranes subjected to electrical signals were found to be greater than that of the membranes which were not subjected to electrical signals, which indicates that the electrical signal causes the piezoelectric membranes to vibrate and delay fouling of the membrane from occurring. The normalized flux of piezoelectric membranes during filtration of a 1% solution of PEG at 175 kPa pressure and about a 30 gr/min cross flow was found to be about 10 times greater for the vibrating membrane than for the non-vibrating membrane. FIG. 7(a) shows that applying electrical signals decreases the initial filtrate flux, while FIGS. 7(b) and (c) show that the average flux and the steady state flux were increased when the piezoelectric membrane was vibrated. These changes appear to be more significant when a greater cross flow was used.

The effect of piezoelectric vibrations on the steady state fluxes through the membranes was significant. A 38% increase in the steady state flux was recorded when the piezoelectric membrane was vibrated with a cross flow of only about 7 gr/min. Increasing the cross flow to about 30 gr/min boosted this enhancement to about 300%. The ratio of the steady state flux to the initial flux, which represents the level of fouling, was also significantly affected by the cross flow. The retained flux of the membranes vibrated with a cross flow of about 30 gr/min was almost 4 times larger than that of the non-vibrated membranes under the same conditions. When a 7 gr/min cross flow rate was used, about a 60% improvement in retained flux was recorded. Filtration using the vibrated membrane with a large cross-flow increased the time for reaching a flux of 10% of the initial flux from 1.5 min to 16 minutes.

From the experimental results discussed above, it can be concluded that fouling can be delayed and controlled using piezoelectric membranes. The results also suggest that membrane fouling could be substantially prevented by providing a cross flow which can be sent to the feed solution and used continuously.

Example 7

Antifouling Properties of Poled PVDF Membranes in Air Filtration Applications

The antifouling properties of the membrane comprising PVDF used in the previous Example can also be used in wider anti-deposition applications. Two identical poled PVDF membranes were covered with 100 nm Au/Pd mixture as electrodes. The membranes were located at the same distance from a carbonate calcium fine powder. A fan at medium speed was used to simulate the turbulence for making dust. One of the membranes was excited at 5 Hz using a sine wave with 9.5V AC amplitude and 17 V DC offset, while the other membrane was not subjected to any electrical signal. The 0.30 experiment was conducted for 48 hours and the surfaces of the samples were then investigated using a light microscope.

The surface of the vibrating membrane was found to be dust-free, while white dust particles could be seen on the surface of the non-vibrating membrane. These results suggest that the piezoelectric membranes of the present invention could also be used in other applications, such as membrane gas separation systems and dust filtration systems.

The present application claims the priority of Australian provisional patent application no. 2009905768, filed 25 Nov. 2009, the contents of which are hereby incorporated by reference.

It will be understood to persons skilled in the art of the invention that many modifications may be made without departing from the spirit and scope of the invention.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A method for altering the characteristics of a membrane, the membrane comprising a dielectric material selected from the group consisting of a dielectric polymer, a piezoelectric polymer, or a piezoelectric ceramic; the method comprising:
heating the membrane and applying an electric field in a direction out of the plane of the membrane to at least a portion of the dielectric material, whereby the at least a portion of the dielectric material becomes aligned with the applied electric field;
wherein the dielectric polymer is selected from the group consisting of polyvinylidene fluoride, nylon, polypropylene, polyester, polycarbonate, Teflon, polyamide, thin film polyamide, composite polyamide and combinations thereof; and
the piezoelectric polymer is selected from the group consisting of polyvinylidene fluoride (PVDF), poly(vinylidene-triflouroethylene), nylon-7, nylon-6, nylon-11, poly(vinyl chloride), poly(acrylonitrile), poly(vinyl acetate), poly(vinylidenecyanide-vinylacetate), vinylidene cyanide copolymers, poly(phenylethernitrile), poly(bicyclobutanecarbonitrile), poly-(lactide), poly-(glycolides), poly-g-methylglutamate, poly-g-benzyl-L-glutamate, chitin, chitosan and combinations thereof;
wherein the electric field is applied by applying a voltage across the membrane, the voltage being increased gradually from zero up to 2500 volts.

2. A method according to claim 1, wherein the electric field is applied in a direction substantially perpendicular to the plane of the membrane.

3. A method according to claim 1, wherein the dielectric material is a dielectric polymer.

4. A method according to claim 1, wherein the dielectric material is the piezoelectric polymer or piezoelectric ceramic material.

5. A method according to claim 1, wherein the dielectric material is the piezoelectric polymer.

6. A method according to claim 1, wherein the electrical field is applied to the dielectric material by applying a potential difference of from about 500 volts to about 2500 volts across the membrane.

7. A method according to claim 1, wherein the electric field is applied to the dielectric material for a time of from 30 minutes up to 8 hours.

8. A method according to claim 1, wherein the membrane comprising the dielectric material is heated to a temperature of from about 80° C. to about 150° C. when the electric field is applied.

9. A method of treating a membrane, the membrane comprising a dielectric material selected from the group consisting of a dielectric polymer, a piezoelectric polymer, or a piezoelectric ceramic; the method comprising:
heating the membrane and applying an electric field in a direction out of the plane of the membrane to at least a portion of the dielectric material;
wherein the dielectric polymer is selected from polyvinylidene fluoride, nylon, polypropylene, polyester, polycarbonate, Teflon, polyamide, thin film polyamide, composite polyamide and combinations thereof; and
wherein the piezoelectric polymer is selected from polyvinylidene fluoride (PVDF), poly(vinylidene-triflouroethylene), nylon-7, nylon-6, nylon-11, poly(vinyl chloride), poly(acrylonitrile), poly(vinyl acetate), poly(vinylidenecyanide-vinylacetate), vinylidene cyanide copolymers, poly(phenylethernitrile), poly(bicyclobutanecarbonitrile), poly-(lactide), poly-(glycolides), poly-g-methylglutamate, poly-g-benzyl-L-glutamate, chitin, chitosan and combinations thereof;
wherein the electric field is applied by applying a voltage across the membrane, the voltage being increased gradually from zero up to 2500 volts.

10. A method according to claim 9, wherein the electric field is applied in a direction substantially perpendicular to the plane of the membrane.

11. A method according to claim 9, wherein the dielectric material is the dielectric polymer.

12. A method according to claim 9, wherein the dielectric material is the piezoelectric polymer or piezoelectric ceramic material.

13. A method according to claim 12, wherein the dielectric material is the piezoelectric polymer.

14. A method according to claim 9, wherein the electrical field is applied to the dielectric material by applying a potential difference of from about 500 volts to about 2500 volts across the membrane.

15. A method according to claim 9, wherein the electric field is applied to the dielectric material for a time of from 30 minutes up to 8 hours.

16. A method according to claim 9, wherein the membrane comprising the dielectric material is heated to a temperature of from about 80° C. to about 150° C. when the electric field is applied.

17. A method for preparing a membrane comprising a poled piezoelectric material, the method comprising poling at least a portion of the piezoelectric material in the membrane in a direction out of the plane of the membrane; and
wherein the piezoelectric material is a piezoelectric ceramic material or a piezoelectric polymer selected from the group consisting of polyvinylidene fluoride (PVDF), poly(vinylidene-triflouroethylene), nylon-7, nylon-6, nylon-11, poly(vinyl chloride), poly(acrylonitrile), poly(vinyl acetate), poly(vinylidenecyanide-vinylacetate), vinylidene cyanide copolymers, poly(phenylethernitrile), poly(bicyclobutanecarbonitrile), poly-(lactide), poly-(glycolides), poly-g-methylglutamate, poly-g-benzyl-L-glutamate, chitin, chitosan and combinations thereof;

wherein the step of poling at least a portion of the piezoelectric material in the membrane includes applying a voltage across the portion of the piezoelectric material in the membrane, the voltage being gradually increased from zero up to 2500 volts.

18. A method according to claim 17, wherein the at least a portion of the piezoelectric material in the membrane is poled in a direction substantially perpendicular to the plane of the membrane.

19. A method according to claim 17, wherein the piezoelectric material is the piezoelectric polymer.

20. A method according to claim 17, wherein the piezoelectric material is the piezoelectric ceramic material.

\* \* \* \* \*